United States Patent [19]

Konishi et al.

[11] Patent Number: 4,823,234
[45] Date of Patent: Apr. 18, 1989

[54] SEMICONDUCTOR DEVICE AND ITS MANUFACTURE

[75] Inventors: Akira Konishi; Teruo Wakano, both of Kyoto, Japan

[73] Assignee: Dai-Ichi Seiko Co., Ltd., Japan

[21] Appl. No.: 880,832

[22] Filed: Jul. 1, 1986

[30] Foreign Application Priority Data

Aug. 16, 1985 [JP] Japan ................. 60-180901
Aug. 16, 1985 [JP] Japan ................. 60-180902
Dec. 19, 1985 [JP] Japan ................. 60-287346

[51] Int. Cl.$^4$ ................................ H02B 1/00
[52] U.S. Cl. ........................... 361/386; 357/81; 357/72; 174/52.2; 361/395; 29/841; 29/844
[58] Field of Search .......... 361/386, 387, 388, 395, 361/399, 410, 409, 412, 401, 408; 357/81, 80, 72, 73; 174/52 FP, 52 PE; 29/841, 842, 844, 845

[56] References Cited

U.S. PATENT DOCUMENTS

| | | | |
|---|---|---|---|
| 3,781,596 | 12/1973 | Galli et al. ................. | 361/409 |
| 3,846,825 | 11/1974 | Budde ....................... | 357/81 |
| 4,338,621 | 7/1982 | Braun ........................ | 357/74 |
| 4,385,202 | 5/1983 | Spinelli et al. ............ | 361/388 |
| 4,424,251 | 1/1984 | Sugishita et al. .......... | 361/410 |
| 4,547,834 | 10/1985 | Dumont et al. ............ | 361/386 |
| 4,561,010 | 12/1985 | Ogihari et al. ............ | 357/81 |
| 4,620,215 | 10/1986 | Lee ........................... | 357/81 |
| 4,628,149 | 12/1986 | Dohya ...................... | 361/402 X |
| 4,630,172 | 12/1986 | Stenerson et al. ......... | 361/386 |
| 4,710,796 | 12/1987 | Ikeya et al. ............... | 357/72 |

FOREIGN PATENT DOCUMENTS

0055811 7/1982 European Pat. Off. ............. 29/845

OTHER PUBLICATIONS

I.B.M. Technical Disclosure, Kerjilian, et al., Jul. 1975 "Thermally Enhanced Multilayer Ceramic Substrate Structure" vol. 18 No. 2, p. 353.

Primary Examiner—A. D. Pellinen
Assistant Examiner—H. L. Williams
Attorney, Agent, or Firm—Robbins & Laramie

[57] ABSTRACT

A semiconductor device of the kind wherein one or more semiconductor chips are housed in a plug-in type package. The package is being molded with a printed wiring substrate, head portions of terminals, and a heat sink for semiconductor chip attachment as an integral part of the package. The one surface of the heat sink is being bared from one side of the package, and the semiconductor chips are being mounted on the other surface of the heat sink facing to the opening of the substrate.

39 Claims, 8 Drawing Sheets

SEMICONDUCTOR DEVICE AND ITS MANUFACTURE

FIELD OF THE INVENTION

This invention relates to a semiconductor device and its manufacture. More particularly, the present invention relates to a semiconductor device comprising a plug-in type package and one or more monolithic semiconductor integrated circuits chips packaged therein, and a method for manufacturing the same.

BACKGROUND OF THE INVENTION

Recently, high packing density of microcircuitry becomes increasingly important as the complexity of electronic equipment advances. In general, monolithic semiconductor integrated circuit chips such as, for example, large scale integration (LSI) chips are housed in solid packages to prevent them from contamination or oxidation resulting from exposure to moisture or harmful gases. The greater the packing density, or the greater the function of microcircuitry, the greater is the number of terminals for external connection of the semiconductor chips. Thus, there is an increasing demand for developments of packages with a number of terminals.

To this end ceramic pin grid array packages with 70 and more terminals have been developed and widely used for packaging of multifunction semiconductor chips and large integration (LSI) chips. However, such ceramic packages make it difficult to take measures to meet the tendency in development of the microcircuitries toward increasing functions and complexity. The ceramic packages must have a relatively large thickness because of their low resistance to mechanical shocks, resulting in increase in size of the packages and semiconductor devices. This also causes increase in weight of the packages since they are generally made of alumina with a relatively large specific gravity.

Since the ceramic pin grid array packages are manufactured by firing ceramic green sheets at a sufficiently high temperature to mature the solid bodies, shrinkage and warping can occur during their firing process. The volume shrinkage varies from about 15 to 20%, thus making it difficult to manufacture packages with high accuracy. The shrinkage of the ceramic body also causes shortcircuiting or breakage of conductor patterns formed thereon, and such troubles increase with the reduction in width of conductor patterns or with the increase in wiring density of the conductor patterns.

Further, the conductor patterns are fired to a sintering temperature of the ceramic body so that they are required to have a high resistance to oxidation and a high melting point. These requirements are fully met only by noble metals such as gold or platinum, thus making it difficult to cut down the manufacturing cost of the packages.

The alumina ceramics for pin grid array packages has a thermal coefficient of linear expansion of 6.8 ppm/°C. which is about 2.5 times as large as a silicon wafer for semiconductor chip production. Such a considerable difference in the thermal expansion coefficient can lead to cracking or damage of the semiconductor chips mounted on the ceramic package since an amount of heat generated in the semiconductor chip increases with the packing density and functions of microcircuitry. Such defect is amplified by low thermal conductivity of the ceramics.

In addition, a manufacturing process of ceramic pin grid array packages is very complicated. For example, the terminal pins must be soldered to proper plated through holes with silver solder at a relatively high temperature of 800°C. A metal or ceramic lid must be attached to the package by the use of sealing material such as sealing glass or resins to protect the semiconductor chip from contamination or oxidation resulting from exposure to moisture or gases.

To solve these problems, various plastic plug-in type packages have been proposed in a plurality of patent specifications such as, for example, Japanese Patent Laid Open Nos. 60-59756, 60-95943, 60-95944, 60-101998 and 60-111489. Such plastic plug-in type packages are generally manufactured by printed circuit techniques in which conductor patterns are formed in a predetermined design on a surface or surfaces of a common board made of a resin to prepare a single-sided or double-sided printed circuit board.

The use of such a printed circuit board makes it possible to reduce the manufacturing cost and the weight of the packages. However, such plastic plug-in type packages for semiconductor devices have such a problem that the conductor patterns formed on the board are exposed to moisture or gases at the ends of the package, resulting in shortcircuiting or corrosion of the conductor patterns. In addition, it is not possible with the printed circuit board to effectively dissipate the heat generated in the semiconductor chips.

SUMMARY OF THE INVENTION

It is therefore an object of the present invention to provide a thin, light weight semiconductor device comprising a plug-in type package and one or more semiconductor chips packaged therein, that makes it possible to take measures to meet the tendency in development of integrated circuits toward increasing functions and complexity.

Another object of the present invention is to provide a semiconductor device of the above kind that can be mass-produced with ease at a low lost and high yield.

Further object of the present invention is to provide a semiconductor device of the above kind having a high water vapor resistance and high reliability.

Still another object of the present invention is to provide a semiconductor device of the above kind having good heat dissipation properties and high thermal fatigue characteristics.

Another object of the present invention is to provide a method for manufacture of semiconductor devices of the above kind that makes it possible to produce plug-in type packages with a high packaging density and a large number of terminals without increase in size and weight of the package.

These and other objects of the present invention are solved by providing a plug-in type package for semiconductor devices comprising a printed wiring substrate composed of an insulating film or thin sheet, said substrate having an opening and a plurality of through holes for terminal attachment and being provided on its one or both sides with printed wirings of conductor patterns; a plurality of terminals fixed to the substrate and connected to the respective conductor patterns; a heat sink for semiconductor chip attachment mounted on the substrate so as to close the opening of the substrate; and a plastic package body molded with said substrate, head portions of the terminals and the heat sink as an integral part of the package, one surface of said heat sink being bared from one side of the package.

According to the present invention there is provided a semiconductor device comprising a plug-in type package and one or more semiconductor chips packaged therein, characterized in that said package comprises a plastic package body molded with a printed wiring substrate, head portions of terminals, and a heat sink for semiconductor chip attachment as an integral part of the package, said printed wiring substrate being composed of an insulating film or thin sheet with an opening and a plurality of through holes for terminal attachment and being provided on its one or both sides with printed wirings of conductor patterns, said terminals being fixed to the substrate and connected to the respective conductor patterns, said heat sink being mounted on the substrate so as to close the opening of the substrate.

Preferably, one surface of the heat sink is being bared from one side of the package, and one or more semiconductor chips are mounted on the other surface of the heat sink facing to the opening of the substrate.

According to the present invention, the plug-in type package having the above construction may be manufactured by a process comprising the steps of preparing a printed wiring substrate having an opening and a plurality of through holes, fixing a plurality of terminals to the substrate by first inserting one ends of their shank into the through holes and then hammering or beating out their projecting ends of their shank into heads, loading the substrate and a heat sink into a cavity of a mold so that the heat sink closes the opening of the substrate, and molding a resin around the substrate, head portions of the terminals and sides of the heat sink to form a package body.

As a material for the insulating film or thin sheet, there may be used those such as heat resistant resins, glass cloth reinforced laminates, glass-ceramics, ceramics and the like.

The heat resistant resins include heat resistant thermoplastic resins and heat resistant thermosetting resins. The heat resistant thermoplastic resins include, without being limited to, aromatic polyamide resins, aromatic polyimide resins, polyphenylene sulfide resins, polyether polyester resins, polyether sulfide resins. The heat resistant thermosetting resins include, without being limited to, epoxy resins, phenol resins, silicone resins, polyamide-imide resins, melamine-formaldehyde resins, and thermosetting polyester resins. Commercially available heat resistant resins are, for example, ECONOL (Trade mark of Sumitomo Chemical Co., Ltd), BECTORA (Trade name of Nippon Polyplastic Industries Co., Ltd.), LOORON (Trade name of E. I. Du Pont de Nemours & Co), and U-POLYMER (Trade name of Unichika Ltd.)

As a resin material for the glass-cloth reinforced laminates, there may be used those such as epoxy resins, melamine resins, polyester resins, and polyimide resins.

Any glass-ceramic material may be used for a film or sheet of glass-ceramics. Commercially available glass-ceramics are, for example, PHOTOCERAM (Trademark of Corning Co., Ltd.), PHOTOFORM (Trademark of Corning Co., Ltd.). Alumina ceramics or silicon carbide ceramics may be used as a material for printed wiring substrates in the form of a film or sheet.

The substrate may have a multi-layer construction comprising two or more insulating films or thin sheets, each being provided with at least one opening and a plurality of through holes for terminal attachment. In this case, the films may be pasted together, but it is not necessarily the case. The printed wirings formed on one substrate may have conductor patterns different from those of the other substrate.

The printed wiring substrate may be a copper-clad film or sheet of the heat resistant resin with conductor patterns etched on one or both sides. The patterns of copper may be formed by chemical plating. The patterns of copper are usually electroplated with silver or gold to improve electrical connection. In this case, nickel or palladium may be electroplated on the copper patterns before plating silver or gold.

The heat sink is made of a thermally conductive material such as metals, sintered alloys of metals or sintered body of metal oxides. The metals for heat sink production include, without being limited to, aluminum, copper, iron, and their respective alloys. The sintered alloys of metals include, without being limited to, sintered alloys of aluminum, copper, iron, and their respective alloys. Among them it is preferred to use a thermally conductive material having a thermal coefficient of linear expansion which is as close as possible to that of silicon wafers for semiconductor chip production to prevent them from cracking or damage resulting from the difference in thermal expansion coefficient. To this end the metal heat sink is preferably electroplated with silver or gold. The heat sink may be provided on its one side with at least one recess for mounting the semiconductor chip to achieve reduction in size and weight of the semiconductor device. The recess of the heat sink may be plated with gold or silver. The heat sink is encapsulated in the package body as an integral part of the package so that its one surface is being bared from the package body. Although the heat sink may be arranged on either side of the substrate, it may be arranged on the opposite side of the printed wirings to avoid shortcircuiting of the conductor patterns. Thus, when the conductor patterns are being formed on the underside of substrate, the heat sink may be arranged on the upper side of the substrate.

As a molding material for the package body, there may be used those such as thermoplastic molding materials and thermosetting molding materials. Thermoplastic resins for thermoplastic molding material include, without being limited to, those such as aromatic polyamide resins, aromatic polyimide resins, polyphenylene sulfide resins, polyether polyester resins, and polyether sulfide resins. Thermosetting resins for thermosetting molding material include, without being limited to, epoxy resins, phenol resins, silicone resins, polyamide-imide resins, melamine-resins, and thermosetting polyester resins. The molding materials may contain, as a filler, 30 to 70% by weight of an inorganic material such as glass fibers or silica.

The terminals are being fixed on the printed wiring substrate and connected to the respective conductor patterns by calking, or, by first inserting a headless end of each terminal pin with a collar into the through hole of the substrate until its collar comes in contact with the substrate and then hammering or beating out the projecting end of its shank into a head. Such a terminal attachment contributes to release the heat from the substrate, thus making it possible to use plastics as a material for substrates. The projecting end of each terminal may be beaten out into a hat-shaped head to insure attachment of the terminals to the substrate and to increase an surface area of the terminal to be encapsulated in the package body. The terminals may be soldered or bonded to proper plated through holes or conductor patterns of the substrate by a solder or electrically conductive binder when a ceramic sheet or film is used for the printed wiring substrate.

When housing one or more semiconductor chips such as LSI chips in the package, the chips are first bonded to the heat sink bared in the cavity of the package body 4, and then wire-bonded to the inside cavity leads of the substrate. However, one or more semiconductor chips may be bonded to the heat sink before molding of the package. In this case, the package body is molded with the semiconductor chips as an integral part of the package.

The present invention makes it possible to manufacture semiconductor devices with high accuracy and high reliability since the package body is molded with a printed wiring substrate, head portions of terminals and the heat sink as an integral part of the package. In addition, the substrate is encapsulated in the package and reinforced by the heat sink and the package body, thus making it possible to use a very thin substrate in the form of a film or thin sheet with a thickness of 0.1 mm or less. This in turn makes it possible to achieve in reduction in size and weight of the semiconductor devices.

These and other objects, features and advantages of the present invention will be further apparent from the following description with reference to the accompanying drawings which show, by way of example only, preferred embodiments thereof.

BRIEF DESCRIPTION OF THE DRAWINGS

Referring now to FIGS. 1 to 4, there is shown a plug-in type package for semiconductor devices according to the present invention, comprising a printed wiring substrate 1, a plurality of terminals 2, a heat sink 3 for semiconductor chip attachment, and a package body 4. The package body is being molded with the substrate 1, head portions of the terminals 2 and the heat sink 3 as an integral part of the package. A top surface of the package body 4 is covered with a barrier 5 of a water vapor proof material such as epoxy resin or polyimide resin to avoid permeation of water vapor into the interior of the package.

As shown in FIG. 2, the printed wiring substrate 1 comprises an insulating thin film 7 of polyimide resin and has printed wirings composed of conductor patterns 8 formed on its underside. The substrate 1 is provided at its central portion with an opening 6 and a plurality of through holes 9 for terminal attachment. The conductor patterns 8 have ring portions 8a formed as an integral part thereof around the through holes 9 in a concentric configuration to insure electrical connection between the terminals 2 and the conductor patterns 8.

Figure 1:
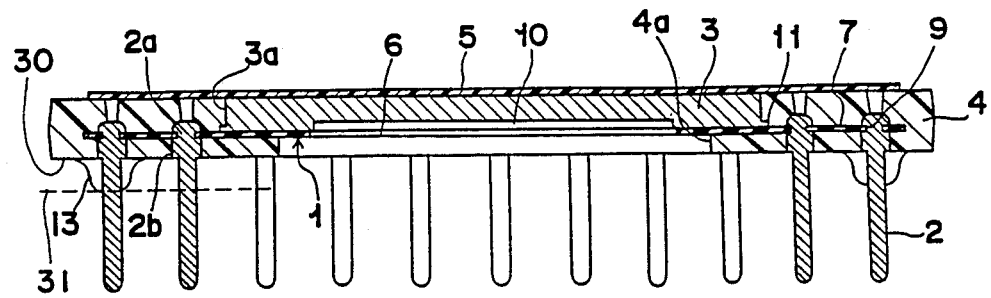
FIG. 1 is a sectional view of a plug-in type package for semiconductor devices according to the present invention.
Figure 2:
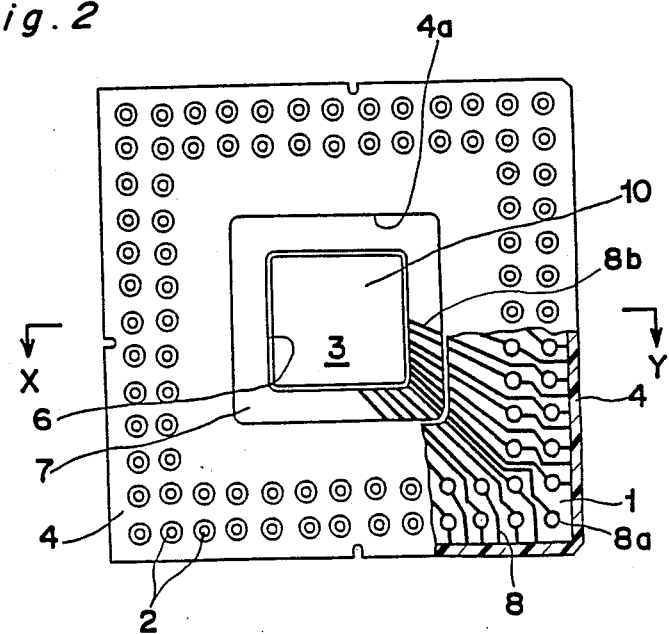
FIG. 2 is a bottom view of the package of FIG. 1 partly broken away to show its interior construction.

Each terminal 2 is fixed to the printed wiring substrate 1 by first inserting a headless end of its shank into the through hole until its collar 2b comes in contact with the substrate, and then hammering or beating out the projecting end of the shank into a hemispherical head 2a. The terminals 2 are electrically connected to the respective patterns 8 and extend downwardly as shown in FIG. 1.

The heat sink 3 is provided at its one side with a recess 10 for semiconductor chip attachment having a size approximately equal to that of the opening. The heat sink 3 is arranged on the upper side of the substrate 1 so that the recess 10 faces toward the opening 6. The heat sink 3 is also provided with a flange or projection 11 around its peripheries 3a to strengthen the bonding between the heat sink 3 and the package body 4.

The package body 4 is made of a polyphenylene sulphide resin and molded with the substrate 1, head portions of the terminals 2 and the heat sink 3 as an integral part of the package. The body 4 is provided at its central portion with a rectangular cavity 4a for housing of the semiconductor chip. The cavity 4a has a larger opening area than that of the opening 6 of the substrate 1 to expose inside cavity leads 8a of the conductor patterns. As an integral part of the package body 4, four standoffs 13 are formed at four corners of the package 1 to separate a bottom plane 30 from a seating plane 31 of the semiconductor device when the device is mounted on a printed circuit board or plugged in a socket.

Although the semiconductor device comprises one or more semiconductor chips housed in the package, they are omitted from FIGS. 1 to 4 for simplification of the drawings. As mentioned below, one or more semiconductor chips such as LSI chips are first bonded to the recess 10 of the heat sink 3 through the cavity 4a of the package body 4, and then wire-bonded to the inside cavity leads 8b of the substrate 1.

The above package according to the present invention may be manufactured, for example, in the following manner. A printed wiring substrate is first manufactured by the photoetching techniques. A copper foil on a copper-clad resin film is coated with a photosensitive emulsion, and exposed to ultraviolet light through a photographic negative of the circuit pattern to harden the emulsion of the exposed area. The film is then placed in a solvent to dissolve the unexposed emulsion from the copper foil and then placed in a etchant bath to remove the copper uncoated by the hardened emulsion. The hardened emulsion is then removed from the exposed areas to complete a printed wiring substrate 1 having copper conductor patterns 8. An opening 6 and a plurality through holes 9 are made in a predetermined design.

Figure 3:
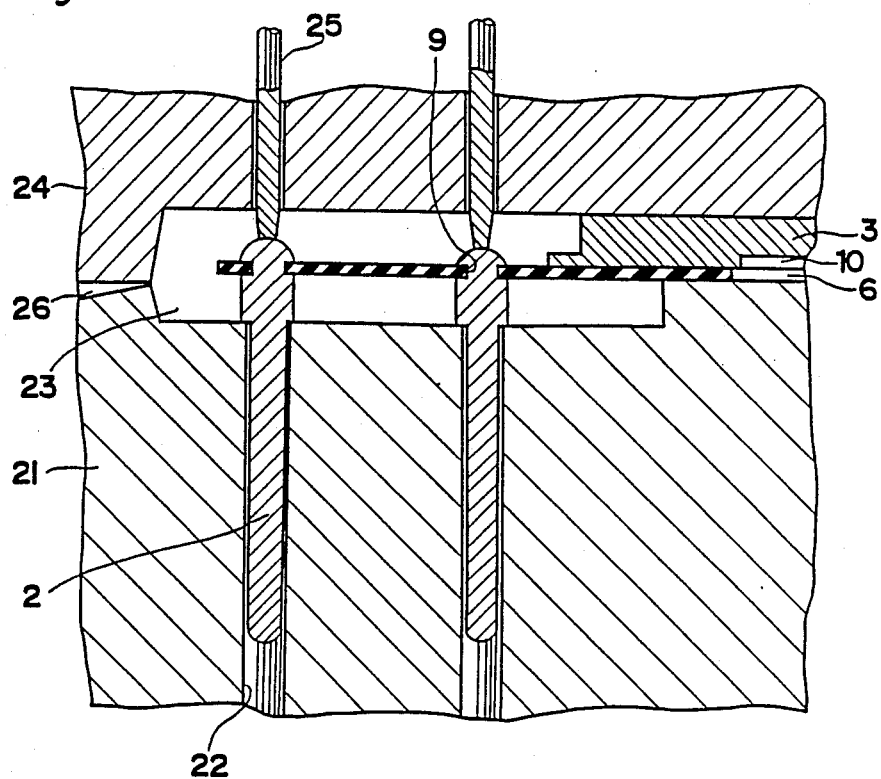
FIG. 3 is an enlarged fragmentary view of a mold for production of the package of FIG. 1 with a printed wiring substrate and a heat sink being loaded therein.

A plurality of terminals 2 are respectively mounted on the substrate 1 by inserting a headless end of a terminal pin with a collar 2b into the through holes 9 from the underside of the printed wiring substrate 1, and then hammering or beating out the projecting end of the shank into hemispherical heads 2a. At the same time, the terminals 2 are electrically connected to the respective conductor patterns 8 since the substrate 1 is sandwiched between the head 2a and the collar portion 2b of the terminal 2 as shown in FIGS. 1 and 3.

Next, the substrate 1 is loaded in a cavity 23 of an injection mold, and then a heat sink 3 is superimposed on the substrate 1 so that it closes the opening 6 of the substrate 1. The mold is closed so that the substrate 1 and the heat sink 3 are held between the upper and lower mold members, as shown in FIG. 3. The terminals 2 are loosely held in holes 22 provided in the cavity bottom of a lower mold assembly 21, but the heads 2a of the terminals 2 are downwardly forced by pins 25 movably mounted in the upper mold assembly 24, to prevent formation of burrs around the collars of terminals.

Figure 4:
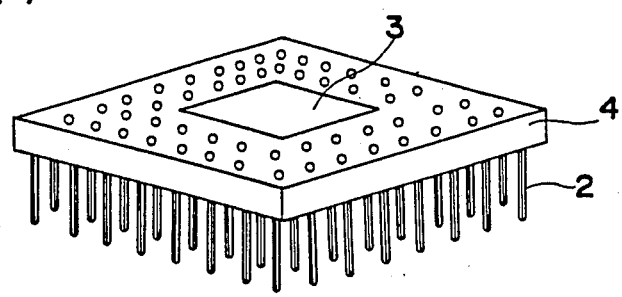
FIG. 4 is a perspective view of the plug-in type package of FIG. 1.

A heat resistant resin is injected into the cavity through a gate 26 under pressure and molded around the substrate 1, head portions of the terminals and ends of the heat sink 3 to form a solid package as shown in FIG. 4. In this case, the movable pins 25 may be moved back just after injection of the resin to leave no mark of the pins behind. Since the lower mold 21 is provided at its cavity bottom with four holes, standoffs 13 are also molded as an integral part of the package body 4. After the molding is complete, the mold is opened and the package is then ejected from the cavity.

Figure 8:
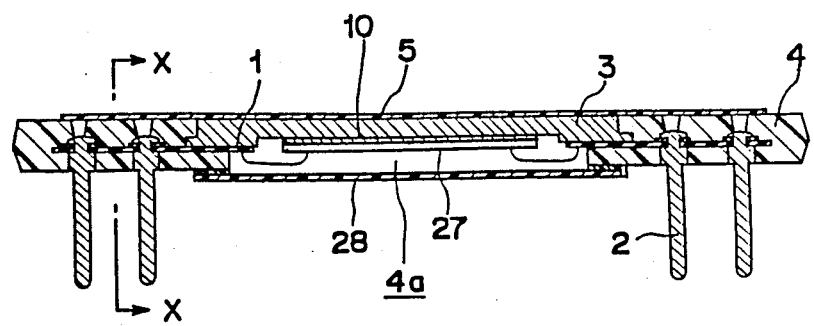
FIG. 8 is a cross sectional view of another form of a semiconductor device of a plug-in type package embodying the present invention.

As shown in FIG. 8, a semiconductor chip 27 is bonded to the surface of the heat sink 3 through the opening 6 of the substrate 1 exposed to the view through the recess 4a of the package body 4, and then wire-bonded to inside cavity leads 8a of the printed wiring 8. A lid 28 is attached by the use of sealing material such as epoxy binder as shown in FIG. 8. A water vapor proof material such as epoxy resin or polyimide resin is then applied to a top surface of the package body 4 to form a water vapor barrier 5. This barrier 5 contributes to prevent the semiconductor chips from contamination resulting from permeation of water vapor through traces of movable pins 25.

A water vapor barrier may be formed on the printed wiring substrate 1 by applying epoxy resin or polyimide resin to the substrate surface on which the conductor patterns are formed, to prevent the printed wirings from deterioration in electrical characteristics caused by permeation of water vapor. This makes it possible to increase the reliability and quality of the semiconductor devices.

According to the present invention, the package body is molded with the printed wiring substrate, head portions of the terminals and heat sink as an integral part of the package. Advantages of such an integrated construction are associated with the reliability and miniaturization of the package, economy and precision of the forming operations. Further there is no fear of shortcircuiting and breakage of the conductor patterns resulting from shrinkage of the package, thus making it possible to manufacture plug-in type packages with high reliability at a low manufacturing cost. The semiconductor chip is mounted on the heat sink with the good thermal conductivity, thus making it possible to prevent the semiconductor chip from cracking or damage resulting from generation of heat. Since the standoff can be formed as an integral part of the package, there is no need to use of two kinds of terminal pins as in the conventional ceramic pin grid array packages, thus making it possible to attach the terminals to the substrate with ease.

In the above embodiment, the terminals 2 are fixed on the substrate 1 by caulking. During hammering operation, mechanical shocks are applied to each head of the terminals 2, so that the substrate 1 is collapsed at the portions to be sandwiched between the collar and head of the terminals 2 because of its weak mechanical strength. This problem can be solved by providing metal rings 12 on the other side of the substrate opposite to the printed circuit side as shown in FIGS. 5 and 6.

Figure 5:
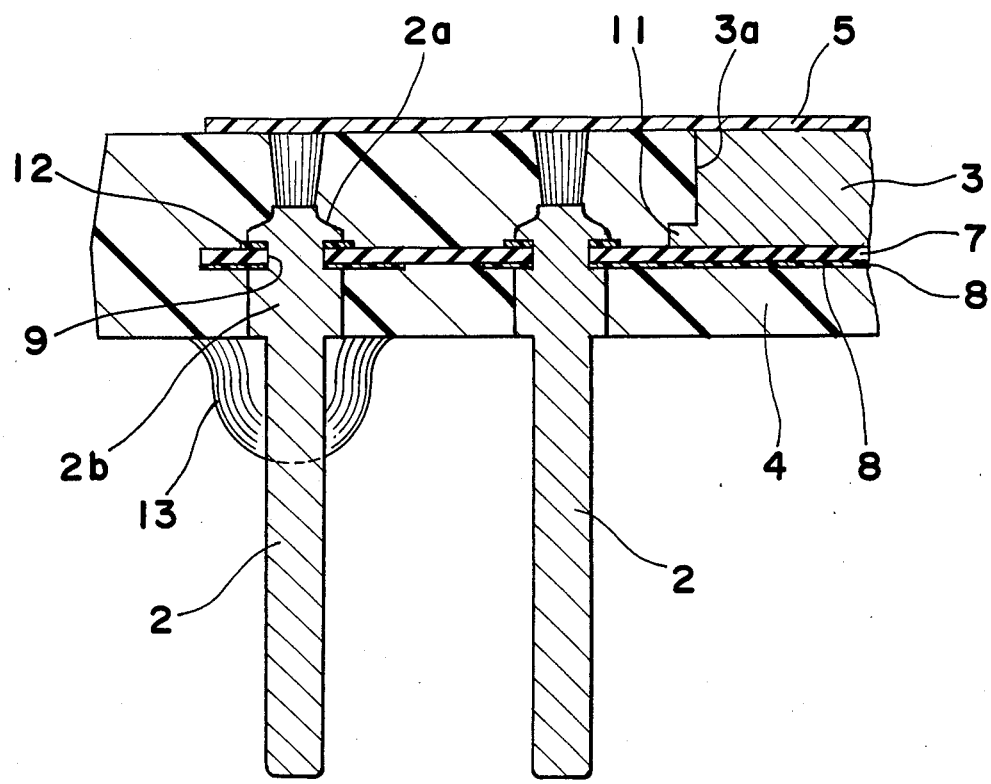
FIG. 5 is an enlarged fragmentary view of another form of a plug-in type package embodying the present invention.
Figure 6:
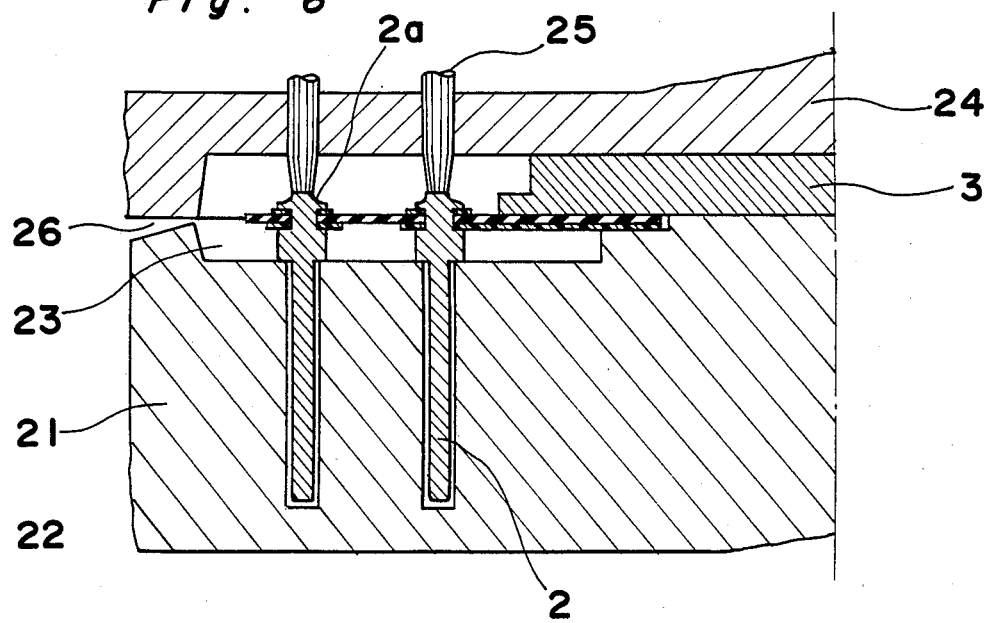
FIG. 6 is an enlarged fragmentary view of a mold used for production of the plug-in type package of FIG. 5 with a substrate and a heat sink loaded therein.
Figure 7:
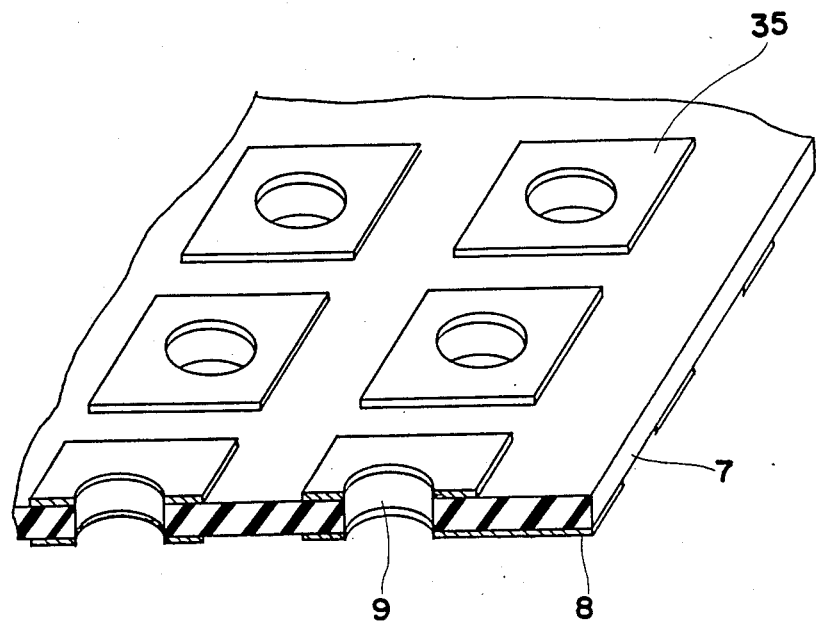
FIG. 7 is a fragmentary perspective view showing modified form of a substrate for a plug-in type package according to the present invention.

A plug-in type package shown in FIGS. 5 and 6 has the same construction as that of FIG. 1 except for that a heat sink 3 has no recess, that the substrate 1 is provided with a plurality of metal rings on the upper side of the printed circuit 8 as reinforcing members 12, and that the projecting ends of the terminals are beaten out into hat-shaped heads 2a. The metal rings 12 may be formed on the substrate by photoetching techniques or screen printing techniques. In the embodiment of FIG. 5, the reinforcing members 12 are formed in the form of a ring, but they may be formed in a rectangular form as shown in FIG. 7.

Figure 9:
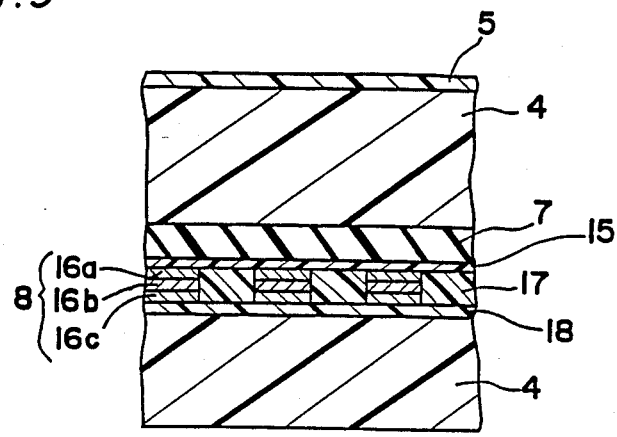
FIG. 9 is an enlarged sectional view taken on line x—x of FIG. 8.
Figure 10:
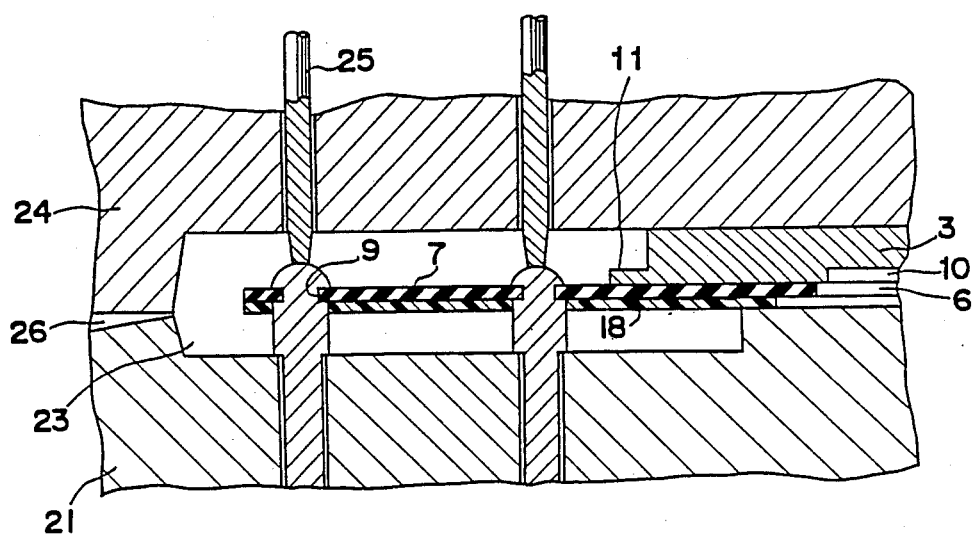
FIG. 10 is an enlarged fragmentary view of a mold for molding of the semiconductor device of FIG. 8 with a substrate and a heat, sink loaded therein.

Referring now to FIGS. 8 to 10, there is shown a semiconductor device according to the present invention, comprising an LSI semiconductor chip 27 housed in a plug-in type package. This package is also molded with a printed wiring substrate 1, terminals 2 mounted at their one ends on the substrate 1 by caulking, and a heat sink 3 as an integral part of the package.

In this embodiment, conductor patterns 8 are composed of three layers, a copper layer 16a, a nickel layer 16b, and a gold layer 16C. Formed between adjacent two conductor patterns is an insulating layer 17 to make the printed wiring surface of substrate smooth. The printed wiring surface is coated with a thin water vapor barrier 18 made of a water vapor proof material such as epoxy resin or polyimide resin.

The LSI chip 27 housed in a mounting cavity 4a of the package is being bonded to a bottom of a recess formed in the heat sink 3 and wire-bonded to the conductor patterns 8. The cavity 4a of the package is closed by a film 28 of a water vapor proof resins to prevent the chip 27 from exposure to water vapor and other harmful gases.

The printed wiring 8 may be manufactured in the following manner. A slit film of a polyimide resin is degreased, dried and then coated with a catalyst paste containing palladium to form a catalyst layer 15. After stamping operation, resist ink is applied to the thus pretreated film by screen printing to form patterns of insulating layers 17 on surface areas where copper is not to be plated. The film is then placed in an electroless plating copper bath to form a copper layer 16a on the uncovered catalyst layer 15. After copper plating, nickel is electroplated on the copper layer 16a to form a nickel layer 16b, followed by gold electroplating. A gold layer 16C is so deposited that its surface is reached to a level equal to that of the insulating coating 17 to make the printed wiring surface of the substrate 1 smooth. A water vapor proof material is then applied to the printed wiring substrate 1 to form a water vapor barrier 18 on the conductor patterns.

Using an injection mold shown in FIG. 10, the plug-in type package of FIG. 8 is manufactured in the same manner as mentioned above.

After molding the plug-in type package, a semiconductor chip 27 is bonded to the recess 10 of the heat sink 3 exposed in the cavity 4a of the package body 4 and its terminals are respectively wire-bonded to leads 8a of the conductor patterns 8. A thin film 28 of water vapor proof resin is attached to the package by the use of epoxy resin to close the cavity 4a, and then epoxy resin is applied to the top surface of the package body 4 to form a water vapor barrier 5.

The semiconductor device of this embodiment have a high reliability and high water-vapor resistance since the water vapor barriers 5 and 18 prevent the printed wiring 8 from exposure to water vapor and other harmful gases even if the semiconductor device is maintained or operated in an atmosphere with a high humidity.

In the embodiment of FIGS. 8 to 10, nickel and gold are electroplated on the copper layer 16a to form printed wiring 8, but other electrically conductive metals such as silver may be used singly or in combination for the formation of the printed wiring.

Figure 11:
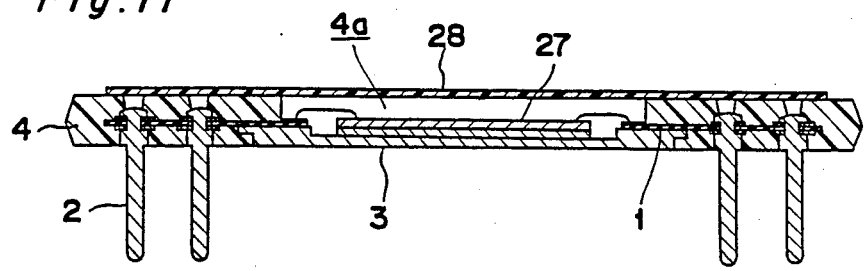
FIG. 11 is a cross sectional view of another form of a semiconductor device embodying the present invention.

FIG. 11 shows another form of a semiconductor device with a plug-in type package according to the present invention comprising a semiconductor chip 27 housed in a plug-in type package. The package is molded with a printed wiring substrate 1, terminals 2 fixed to the substrate 1, and a heat sink 3 as an integral part of the package. In this embodiment, printed wirings 8 are being formed on an upper side of the substrate 1, and the heat sink 3 is arranged on the underside of the substrate 1 so that its recess for semiconductor attachment faces in the direction opposite to the extending direction of the terminals 2.

Figure 12:
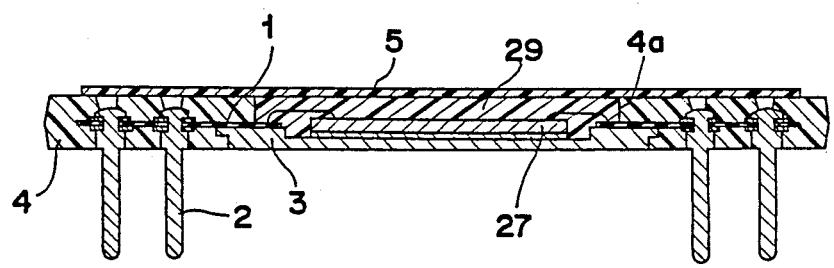
FIG. 12 is a cross sectional view of a still another form of a semiconductor device embodying the present invention.

FIG. 12 shows a modified form of a semiconductor device of FIG. 11. In this embodiment, a cavity 4a of the package is filled with a filler 29. The filler may be the same material as that of the package body 4.

In the embodiment of FIG. 12, a semiconductor chip is attached to the heat sink 3 after molding of the package, but this may be carried out before molding of the package. In this case, the semiconductor chip may be packaged in the following manner. In the first step, terminals 2 are fixed to the printed wiring substrate 1 and the heat sink 3 is then attached to the substrate 1 by the use of a suitable binder. Next, a semiconductor chip 27 is bonded to the heat sink 3 and wire-bonded to the conductor patterns 8 of the substrate, and a plug-in type package is molded by transfer molding or injection molding with the printed wiring substrate, terminals, heat sink and the chip as an integral part of the package.

Figure 13:
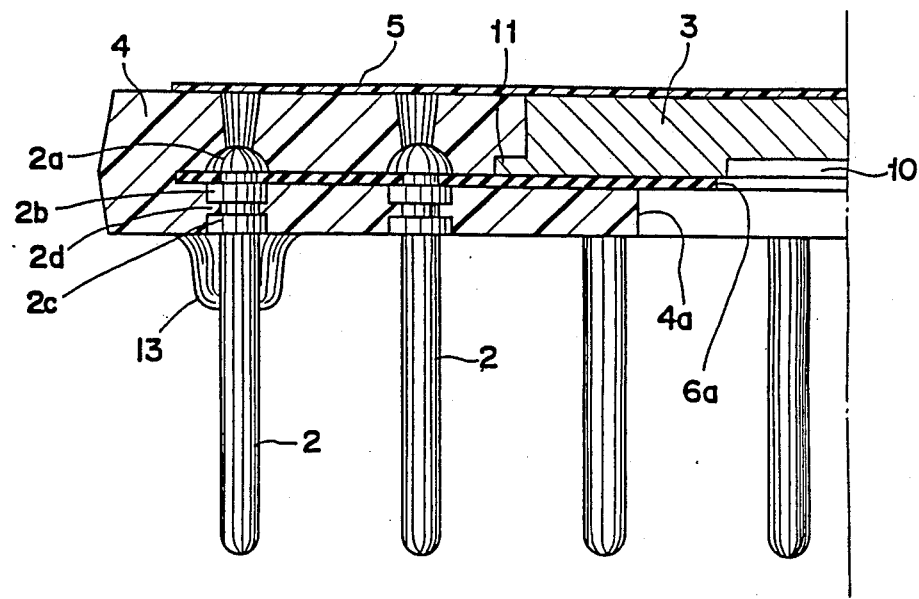
FIG. 13 is an enlarged fragmentary cross sectional view of a semiconductor device of the present invention.

Referring now to FIG. 13, there is shown another form of a semiconductor device embodying the present invention. This semiconductor device has the same construction as that of FIG. 1 except for that terminals 2 have spaced collar portions 2b and 2C to improve the mechanical connection between the terminals 2 and the package body 4. The molding compound is molded in annular grooves 2d of the terminals 2.

Figure 14:
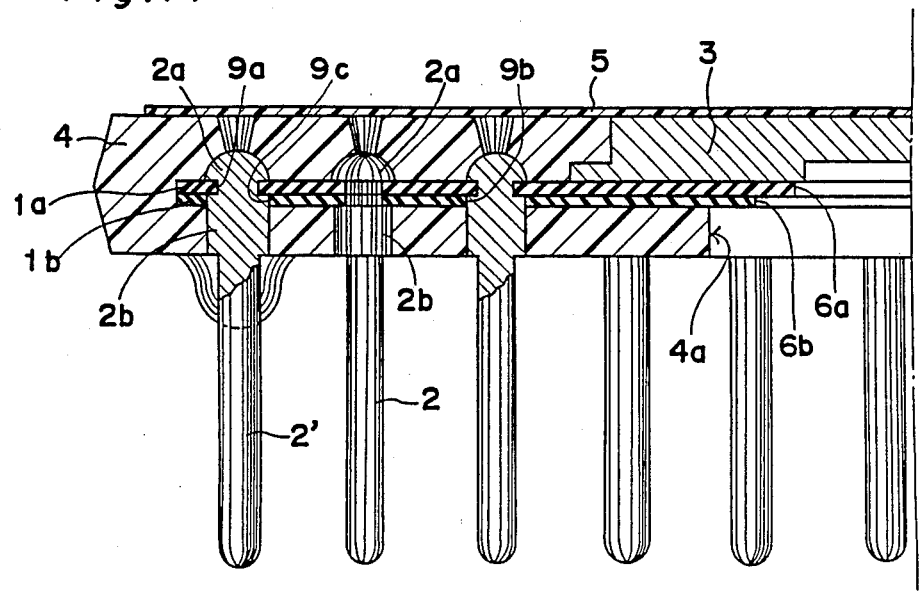
FIG. 14 is an enlarged fragmentary cross sectional view of a semiconductor device of the present invention.

FIG. 14 shows another form of a semiconductor device embodying the present invention. In this embodiment, a package comprises two printed wiring substrates 1a and 1b, two kinds of terminals 2, 2' fixed at their one ends to the substrate 1 by caulking, a heat sink 3 for semiconductor attachment, and a package body 4 molded with the substrate 1, head portions of the terminals 2, 2' and the heat sink 3 as an integral part of the package.

Each substrate 1a, 1b is composed of an insulating thin film having a plurality of through holes and an opening and being provided with conductor patterns on its underside. The lower substrate 1b is provided with two kinds of through holes 9b and 9C which are different in diameter. The diameter of the through holes 9b is equal to that of the through holes 9a of the upper substrate 1a, while the diameter of the other through holes 9C is larger than that of the through holes 9a. An opening 6b of the substrate 1b is larger in size than that of the substrate 1a.

The terminals 2 have a collar 2b which is smaller in width than a collar 2b' of the terminals 2'. The terminals 2 are being fixed to the substrates 1a, 1b and electrically connected to the respective conductor patterns of the lower substrates 7b, while the terminals 2' are being mounted on the substrates 1a through the through holes 9C ad electrically connected to respective conductor patterns of the upper substrate 1a.

The semiconductor device of FIGS. 14 may be manufactured, for example, in the following manner. Using a single-sided copper-clad thin film, printed wiring substrates 1a, 1b are respectively manufactured by etching techniques. The substrates 1a is superimposed or bonded to the other substrate 1b, and terminals 2 and 2' are fixed to the substrate by first inserting headless pins into the through holes 9a of the upper substrate 1a through the through holes 9b or 9c of the lower substrates 7b and then hammering or beating out the projected ends of the shank into head 2a with a hammer or supersonic vibration. Thus, two substrates 1a and 1b are riveted together by the terminals 2 and the terminals 2, 2' are electrically connected to the respective conductor patterns 8. Then the substrates 1a and 1b are then loaded together with a heat sink 3 in a cavity of the mold and the package is molded with the substrate 1, head portions of the terminals 2, 2' and the heat sink 3 as an integral part of the package.

In the embodiments of FIG. 14, two kinds of terminal pins have been used to make the terminal length uniform, but it is not necessarily required for a certain purpose. For example, the terminals 2' may be replaced with the terminals 2. In this case, the length of the terminals 2' becomes shorter than that of the terminals 2 by a length corresponding a thickness of the substrate. No problem occurs since the package of the present invention makes it possible to use very thin substrates with a thickness of about 0.1 mm or less.

Figure 15:
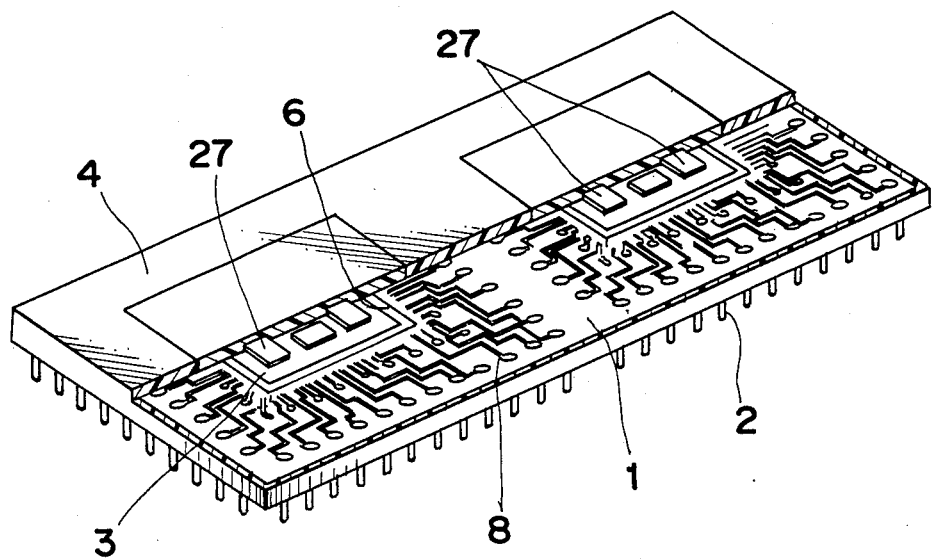
FIG. 15 is a perspective view of an another form of a semiconductor device embodying the present invention, partly broken away to show its interior construction.
Figure 16:
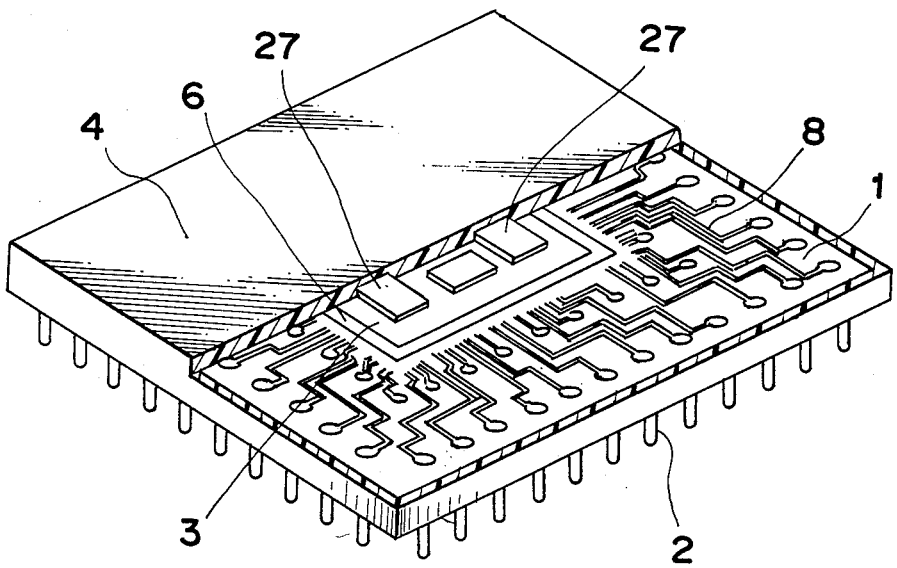
FIG. 16 is a perspective view of another form of a semiconductor device embodying the present invention, partly broken away to show its interior construction.

In the foregoing embodiments, one semiconductor chip is being housed in the package, but two or more semiconductor chips can be housed in the plug-in type package of the present invention without considerable increase in size and weight of semiconductor devices as shown in FIGS. 15 and 16.

A semiconductor device shown in FIG. 15 comprises six semiconductor chips 27 mounted on a heat sink 3. The package body 4 is molded with a printed wiring substrate 1, head portions of terminals 2, and the heat sink 3 as an integral part of the package. The substrate 1 is provided with two openings 6. The semiconductor chips may be semiconductor logical devices, semiconductor memory chips, and the like. The cavity 4a of the package is filled with a filler 29 in the same manner as in the embodiment of FIG. 12.

FIG. 16 shows another form of a semiconductor device embodying the present invention comprising three semiconductor chips housed in a plug-in type package. The package body 4 is molded with the semiconductor chips as an integral part of the package. The semiconductor device with such a construction may be manufactured in the following manner. Firstly, terminals 2 are fixed to a printed wiring substrate 1 and then a heat sink 3 is attached to the substrate 1 by the use of a suitable binder. The semiconductor chips 27 are bonded to the heat sink 3 and wire-bonded to the conductor patterns 8 of the substrate, and the package body is injection-molded with the printed wiring substrate 1, head portions of the terminals 2, the heat sink 3 and the semiconductor chips 27 as an integral part of the package.

What we claim is:

1. A carrier for semiconductor device, comprising;
a plug-in type package having one or more semiconductor chips packaged therein;
said plug-in type package comprising a flexible printed wiring substrate, electrically conductive terminals attached to said substrate, a heat sink for semiconductor attachment, and a surrounding package body,
said substrate comprising an insulating film or this sheet with an opening and a plurality of through holes for terminal attachment, and printed wirings of conductor patterns formed on one or both sides of said insulating film or thin sheet;
said terminals each having a collar portion, and each being inserted at its head portion into a respective through hole of the substrate so that said collar is in contact with said substrate, said terminals being electrically connected at said head or collar portions to the respective conductor patterns on the substrate;
said heat sink being fixedly attached to said substrate so as to close the opening of said substrate, and
said substrate, head and collar portions of said terminals and said heat sink being encapsulated in said package body so that one surface of said heat sink is exposed from one side of the package body.

2. The carrier according to claim 1 wherein the substrate is composed of a heat resistant resin in the form of a film or thin sheet.

3. The carrier according to claim 2 wherein the heat resistant resin is the one selected from the group consisting of epoxy resins, aromatic polyamide resins, aromatic polyimide resins, phenol resins, and thermosetting polyester resins.

4. The carrier according to claim 1 wherein the substrate is composed of a film or a thin sheet of a glass fiber reinforced heat resistant resin.

5. The carrier according to claim 4 wherein the glass fiber reinforced heat resistant resin consists of glass fabric and a heat resistant resin selected from the group consisting of epoxy resins, aromatic polyamide resins, aromatic polyimide resins, melamine resins, phenol resins, and thermosetting polyester resins.

6. The carrier according to claim 1 wherein the substrate is composed of a film or sheet of ceramics.

7. The carrier according to claim 6 wherein said ceramics consists of alumina.

8. The semiconductor device according to claim 6 wherein the ceramic consists of silicon carbide.

9. The carrier according to claim 1 wherein the substrate is a multi-layered film, each film being provided with at least one opening, a plurality of through holes for terminal attachment, and the conductor patterns different from one another.

10. The carrier according to claim 9 wherein the substrate consists of two sheets of polyimide resin films.

11. The carrier according to claim 1, wherein each said terminal is provided with a deformed head to sandwich the substrate between said head and a collar, thereby electrically connecting the terminal to a respective conductor.

12. The carrier according to claim 1 and further comprising a washer around each pin which prevents hammering of the pin into a head from damaging the substrate.

13. The carrier according to claim 1 wherein the through holes are plated with nickel and silver or gold.

14. The carrier according to claim 1 wherein the conductor patterns of the substrate are composed of a copper layer and a silver or gold layer electroplated thereon.

15. The carrier according to claim 1 wherein the conductor patterns of the substrate are composed of a copper layer, a nickel layer, a palladium layer and a silver or gold layer plated one on the other.

16. The carrier according to claim 1 wherein the conductor patterns of the substrate are composed of a copper layer chemically plated on the surface of the thin resin film substrate, and a silver or gold layer electrically plated on the copper layer.

17. The carrier according to claim 16 wherein the copper layer is formed on a palladium layer formed on the substrate.

18. The carrier according to claim 7 wherein the heat sink is made of a thermally conductive material.

19. The carrier according to claim 18 wherein the heat sink is made of aluminum, aluminum alloy, copper, copper alloy, iron or its alloy.

20. The carrier according to claim 19 wherein the heat sink is plated with silver or gold.

21. The carrier device according to claim 18 wherein the thermally conductive material for heat sink is a sintered body of a metal or a metal oxide.

22. The carrier device according to claim 21 wherein the sintered body is of copper or its alloy.

23. The carrier according to claim 18 wherein the heat sink is being provided on its one side with at least one recess for mounting the semiconductor chip.

24. The carrier according to claim 23 wherein the recess of the heat sink is being plated with gold or silver.

25. The carrier according to claim 23 wherein the recess of the heat sink is provided at a central portion of the heat sink.

26. The carrier according to claim 23 wherein the heat sink is encapsulated in the package body so that the recess faces towards the extending direction of the terminals.

27. The carrier according to claim 23 wherein the heat sink is encapsulated in the package body so that the recess faces toward a direction opposite to the extending direction of the terminals.

28. The carrier according to claim 1 wherein the package body is molded with a heat resistant resin.

29. The carrier according to claim 28 wherein the heat resistant material contains an inorganic material as a filler.

30. The carrier according to claim 29 therein a content of the inorganic material is 30 to 70 percent by weight.

31. The carrier according to claim 29 wherein the inorganic material is the one selected from the group consisting of glass fibers and silica.

32. The carrier according to claim 28 wherein the heat resistant material is the one selected from the group consisting of epoxy resins, phenol resins, thermosetting polyester resins, melamine resins, aromatic polyamide resins, and aromatic polyimide resins.

33. The carrier according to claim 1 and further comprising a solder bond between each base portion and its respective conductor.

34. The carrier according to claim 1 wherein a cavity of the package body is filled with a resin.

35. The carrier according to claim 1 wherein a cavity of the package body is sealed with a lid.

36. The carrier according to claim 1 wherein the package body is provided with at least one standoff as an integral part of the body.

37. The carrier according to claim 36 wherein standoffs are molded concentric with the axis of the terminals.

38. A method for manufacturing carriers for semiconductor devices, comprising the steps of;

preparing a printed wiring substrate having an opening and a plurality of through holes, fixing a plurality of terminals, each having a collar, to the substrate, said fixing of terminals being carried out by inserting a shank of each terminal into a respective through hole of the substrate so that the collar comes in contact with the substrate, and then deforming a projecting end of the shank into a head, in order to sandwich the substrate between the collar and the head of the terminals;

loading the substrate fixed with the terminals into a cavity of an injection mold and placing a heat sink on the substrate to span the opening of the substrate, holding the heat sink and substrate in the mold; and injecting a resin into the cavity of the mold to form a package body which encapsulates the following; the head and collar portions of the terminals, part of the substrate, and part of the heat sink, leaving another part of the heat sink exposed for mounting the carrier thereon.

39. A plug-in type package for semiconductor devices, comprising;

a flexible printed wiring substrate, electrically conductive terminals attached to said substrate, a heat sink for semiconductor attachment, and a surrounding package body, said substrate having a thin sheet with an opening and a plurality of through holes for terminal attachment, and having printed wirings of conductor patterns formed on one or both sides of said insulating film or thin sheet;

said terminals each having a collar portion and being inserted at its head portion through a respective through hole of the substrate so that the collar is in contact with the substrate, the terminals being electrically connected at the head of collar portions to the respective conductor patterns on the substrate;

said heat sink being fixedly attached to the substrate so as to close the opening of the substrate, and said substrate, head and collar portions of the terminals and the heat sink being encapsulated in said package body so that one surface of said heat sink is exposed from one side of the package body.

* * * * *